United States Patent
Iwamoto et al.

(10) Patent No.: US 8,450,904 B2
(45) Date of Patent: May 28, 2013

(54) PIEZOELECTRIC DEVICE

(75) Inventors: Takashi Iwamoto, Nagaokakyo (JP); Hajime Kando, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/181,546

(22) Filed: Jul. 13, 2011

(65) Prior Publication Data

US 2011/0266918 A1    Nov. 3, 2011

Related U.S. Application Data

(63) Continuation of application No. PCT/JP2010/050244, filed on Jan. 13, 2010.

(30) Foreign Application Priority Data

Jan. 15, 2009    (JP) .................................. 2009-006546

(51) Int. Cl.
    *H03H 9/25*    (2006.01)

(52) U.S. Cl.
    CPC ..................................... *H03H 9/25* (2013.01)
    USPC ..................................................... 310/313 R

(58) Field of Classification Search
    USPC ........................................................... 310/313
    See application file for complete search history.

(56) References Cited

U.S. PATENT DOCUMENTS

| | | | |
|---|---|---|---|
| 6,078,123 A * | 6/2000 | Tanaka et al. | 310/313 R |
| 6,445,265 B1 | 9/2002 | Wright | |
| 6,710,682 B2 * | 3/2004 | Onishi et al. | 333/193 |
| 7,259,032 B2 * | 8/2007 | Murata et al. | 438/26 |
| 7,427,824 B2 * | 9/2008 | Iwamoto et al. | 310/344 |
| 7,854,050 B2 * | 12/2010 | Aikawa et al. | 29/25.35 |
| 8,072,118 B2 * | 12/2011 | Omote et al. | 310/313 R |
| 2005/0116352 A1 * | 6/2005 | Warashina et al. | 257/777 |
| 2006/0283252 A1 * | 12/2006 | Liu et al. | 73/649 |
| 2007/0188047 A1 | 8/2007 | Tanaka | |

(Continued)

FOREIGN PATENT DOCUMENTS

| JP | 2002-534886 A | 10/2002 |
|---|---|---|
| JP | 2003-017967 A | 1/2003 |
| JP | 2007-251910 A | 9/2007 |
| JP | 2007-325013 A | 12/2007 |

OTHER PUBLICATIONS

Official Communication issued in International Patent Application No. PCT/JP2010/050244, mailed on Mar. 16, 2010.

*Primary Examiner* — J. San Martin
(74) *Attorney, Agent, or Firm* — Keating & Bennett, LLP

(57) ABSTRACT

A piezoelectric device includes IDT electrodes and solves various problems resulting from the IDT electrodes. The piezoelectric device has a configuration in which a piezoelectric thin-film and a support are bonded together such that the piezoelectric thin-film is supported by the support. IDT electrodes and interconnect electrodes are provided on a surface of the piezoelectric thin-film that is located on the support side. The piezoelectric thin-film includes a region in which the IDT electrodes are provided and on which no support is provided but an opening is formed. This allows the IDT electrodes and the piezoelectric thin-film and the IDT electrode-formed region of the piezoelectric thin-film to not be in contact with the support, thereby defining a membrane including only the piezoelectric thin-film and the IDT electrodes as elements, the piezoelectric thin-film and the IDT electrodes being disposed therein and being important for properties of the piezoelectric device.

5 Claims, 14 Drawing Sheets

U.S. PATENT DOCUMENTS

2007/0278897 A1 12/2007 Ozaki
2008/0252396 A1 10/2008 Ruile et al.
2010/0225202 A1* 9/2010 Fukano et al. ............ 310/313 C
2011/0018389 A1* 1/2011 Fukano et al. ............ 310/313 R

* cited by examiner

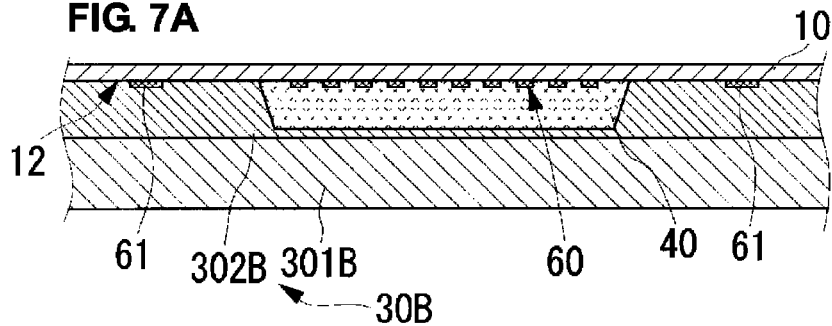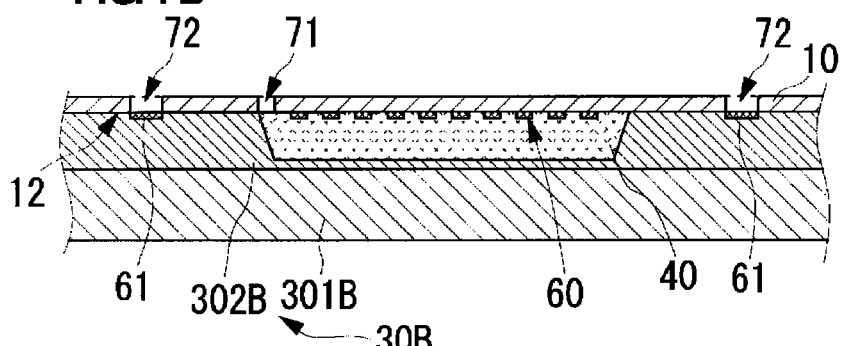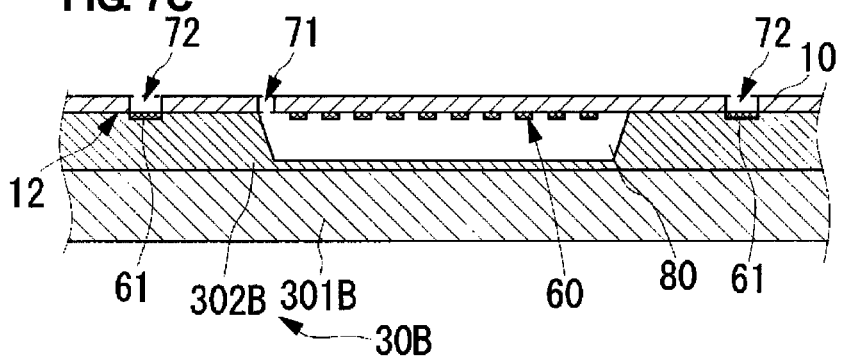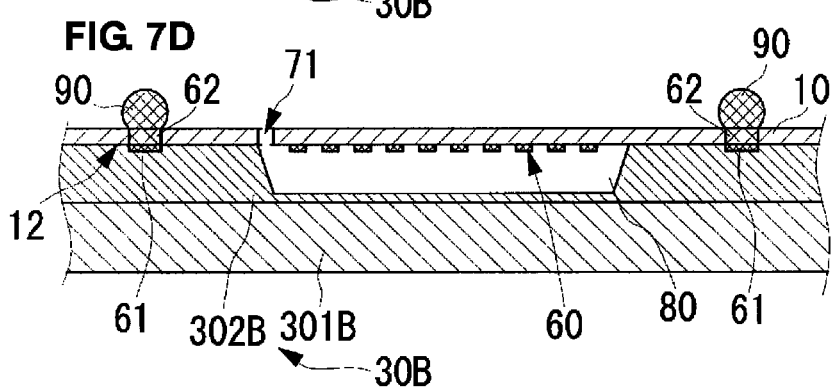

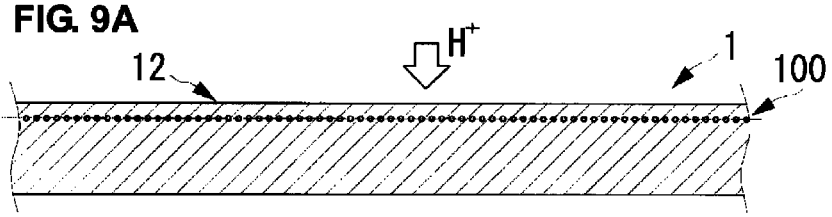
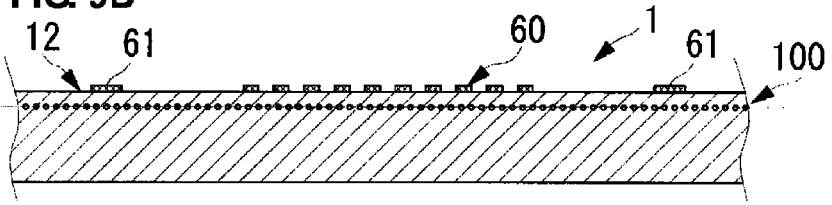
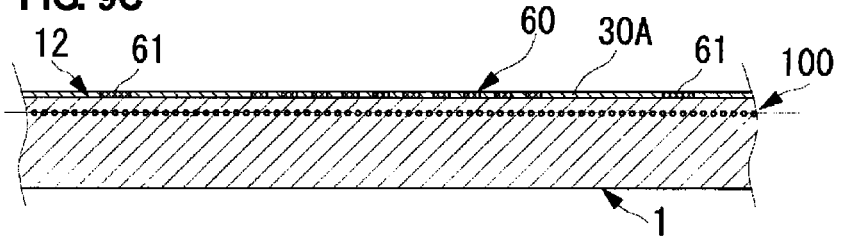
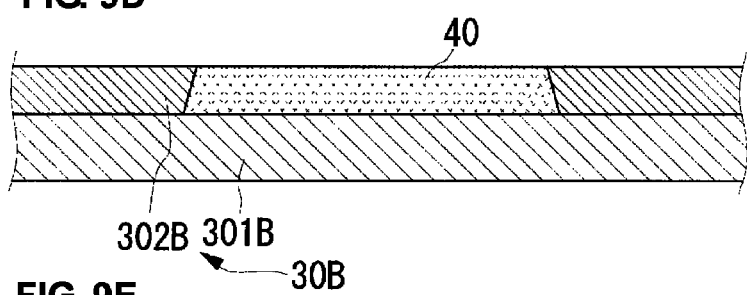
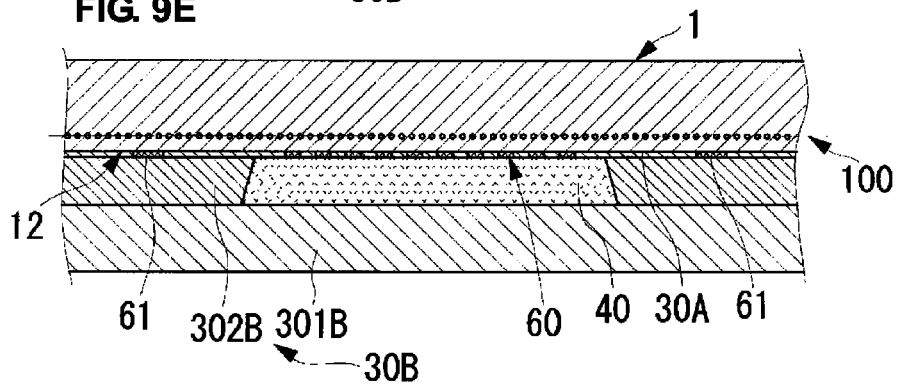

PIEZOELECTRIC DEVICE

BACKGROUND OF THE INVENTION

1. Field of the Invention

The present invention relates to a piezoelectric device including a thin film of a piezoelectric single crystal and a method for manufacturing the piezoelectric device.

2. Description of the Related Art

Currently, there are various piezoelectric devices including single-crystalline piezoelectric substrates. In particular, there are surface acoustic wave and plate wave devices including IDT (Interdigital Transducer) electrodes (also referred to as comb-shaped electrodes). Plate waves are those which have vibration displacements on both surfaces of an elastic substance and which propagate along the surfaces. An example of the plate waves is shown in, for example, FIG. 1.19 of Danseiha Soshi Gijutsu Handobukku. Among plate waves propagating in anisotropic crystals such as $LiTaO_3$ and $LiNbO_3$ single crystals are not only pure SH waves (a $u_2$ component only) and Lamb waves (a $u_1$ component and a $u_3$ component only) but also modes propagating with displacement components such as $u_1$ $u_2$, and $u_3$ being combined (that is, SH waves having a slight $u_1$ component and a slight $u_3$ component and Lamb waves having a slight $u_2$ component).

A conventional piezoelectric device including such IDT electrodes has, for example, a structure disclosed in Japanese Unexamined Patent Application Publication No. 2007-251910. In particular, the conventional piezoelectric device includes a composite piezoelectric substrate including a piezoelectric thin-film and a support bonded thereto and also includes IDT electrodes formed on a surface of the piezoelectric thin-film that is located opposite to the support. In order not to inhibit the vibration of a region of the piezoelectric thin-film that has the IDT electrodes formed therein, a space is formed on the side of bonded surfaces of the piezoelectric thin-film and the support so as to correspond to the IDT electrode-formed region.

However, the conventional piezoelectric device, which includes the IDT electrodes as disclosed in Japanese Unexamined Patent Application Publication No. 2007-251910, is configured such that the IDT electrodes are exposed at the surface of the conventional piezoelectric device. Therefore, there are various problems as described below.

In back-end steps of a process for manufacturing a module for mounting the piezoelectric device, metal powders and the like may adhere to a surface thereof. This causes short circuits between electrode fingers of the IDT electrodes. If an insulating layer made of $SiO_2$ or SiN is formed on an IDT electrode-formed surface for the purpose of preventing such a short-circuit failure, the vibration of the piezoelectric thin-film will be inhibited by the insulating layer.

If organic contaminants adhere thereto, gases will possibly be generated from the contaminants because of the thermal history of the back-end steps. The generated gases corrode the IDT electrodes to vary the excitation mode thereof and therefore adversely affect properties thereof. Particularly, in a sensor which includes IDT electrodes and which operates to detect the mass applied to a piezoelectric thin-film portion (membrane) not supported by a support, such corrosion leads to the deterioration of detection performance and therefore seriously reduces functions of the sensor.

In particular, for a plate wave device, the frequency thereof is significantly affected by the thickness of a piezoelectric thin-film defining a membrane. Therefore, when the piezoelectric thin-film is polished for frequency adjustment, the IDT electrodes are also ground or milled, whereby properties thereof are deteriorated. Likewise, when the thickness of the piezoelectric thin-film is adjusted by ion milling, the electrodes are ground or milled. When the membrane has an opening facing a support, a surface of the piezoelectric thin-film that faces a surface having the IDT electrode can be polished or milled. However, a boundary portion near the support cannot be polished or milled to a uniform thickness because a recessed portion is ground or milled. This causes differences in properties.

SUMMARY OF THE INVENTION

Thus, preferred embodiments of the present invention provide a piezoelectric device that solves various problems resulting from the use of IDT electrodes as described above and also provide a method for manufacturing the piezoelectric device.

According to a preferred embodiment of the present invention, a piezoelectric device includes a piezoelectric thin-film supported by a support. In the piezoelectric device, IDT electrodes are located on a support side of the piezoelectric thin-film and a space is provided over an IDT electrode region of the piezoelectric thin-film that is located on the support side such that the IDT electrodes are not in contact with the support.

In this configuration, the IDT electrodes are not located on the piezoelectric device but are located in the piezoelectric device. As a result, no metal powder or organic contaminant adheres to the IDT electrodes. Since the IDT electrode-formed region is not in contact with the support, the vibration of a membrane is not inhibited. This can prevent failure due to attached substances and negative influences thereof on properties without deteriorating structural properties of devices.

A method for manufacturing a piezoelectric device according to another preferred embodiment of the present invention includes a step of forming an ion-implanted layer by implanting ions into a principal surface of a piezoelectric substrate, a step of forming IDT electrodes on an ion implantation surface of the piezoelectric substrate, a step of providing a support on the ion implantation surface of the piezoelectric substrate, a step of etching the support to expose the IDT electrodes, and a step of delaminating a piezoelectric thin-film from the piezoelectric substrate.

In the manufacturing method, after the IDT electrodes are formed on a surface of the piezoelectric substrate that is to be the piezoelectric thin-film, the support is provided on the IDT electrode-formed surface. The support corresponding to a region in which the IDT electrodes are formed is removed by etching and the piezoelectric thin-film is delaminated from the piezoelectric substrate, whereby a membrane is formed. Therefore, the addition of a complex, complicated manufacturing step is not necessary and the piezoelectric device can be manufactured so as to have the above-described effective configuration.

A method for manufacturing a piezoelectric device according to a further preferred embodiment of the present invention includes a step of forming an ion-implanted layer by implanting ions into a principal surface of a piezoelectric substrate, a step of forming IDT electrodes on an ion implantation surface of the piezoelectric substrate, a step of forming a sacrificial layer in a sacrificial layer-forming region including a region in which the IDT electrodes are formed and which is disposed in the ion implantation surface of the piezoelectric substrate, a step of providing a support on the ion implantation surface of the piezoelectric substrate, a step of delaminating a piezoelectric thin-film from the piezoelectric substrate, and a step of removing the sacrificial layer.

In this manufacturing method, after the IDT electrodes are formed on a surface of the piezoelectric substrate that is to define the piezoelectric thin-film, the sacrificial layer is formed on the IDT electrode-formed surface and the support is further provided thereon. Subsequently, the piezoelectric thin-film is delaminated from the piezoelectric substrate and the sacrificial layer is removed. A space (void) is formed between the piezoelectric thin-film and the support by the removal of the sacrificial layer and the IDT electrodes are arranged in the space. Therefore, the addition of a complex, complicated manufacturing step is not necessary and the piezoelectric device can be manufactured so as to have an effective configuration.

A method for manufacturing a piezoelectric device according to yet another preferred embodiment of the present invention includes a step of forming an ion-implanted layer by implanting ions into a principal surface of a piezoelectric substrate, a step of forming IDT electrodes on a support, a step of bonding an IDT electrode-formed surface of the support to an ion implantation surface of the piezoelectric substrate, a step of etching the support to expose the IDT electrodes, and a step of delaminating a piezoelectric thin-film from the piezoelectric substrate.

In this manufacturing method, unlike the above manufacturing methods, after the IDT electrodes are formed on a surface of the support, the support and the piezoelectric substrate are bonded together. The support corresponding to a region in which the IDT electrodes are formed is removed by etching and the piezoelectric thin-film is delaminated from the piezoelectric substrate, whereby a membrane is formed. Therefore, the addition of a complex, complicated manufacturing step is not necessary and the piezoelectric device can be manufactured so as to have an effective configuration.

A method for manufacturing a piezoelectric device according to a further preferred embodiment of the present invention includes a step of forming an ion-implanted layer by implanting ions into a principal surface of a piezoelectric substrate, a step of forming a sacrificial layer on a support, a step of forming IDT electrodes in a sacrificial layer-forming region of the support, a step of bonding an IDT electrode-formed surface of the support to an ion implantation surface of the piezoelectric substrate, a step of delaminating a piezoelectric thin-film from the piezoelectric substrate, and a step of removing the sacrificial layer.

In this manufacturing method, unlike the above manufacturing methods, after the sacrificial layer and the IDT electrodes are formed on a surface of the support, the piezoelectric substrate and the support are bonded together. The piezoelectric thin-film is delaminated from the piezoelectric substrate and the sacrificial layer is then removed. A space (void) is formed between the piezoelectric thin-film and the support by the removal of the sacrificial layer and the IDT electrodes are arranged in the space. Therefore, the addition of a complex, complicated manufacturing step is not necessary and the piezoelectric device can be manufactured so as to have an effective configuration.

According to various preferred embodiments of the present invention, the following problems can be solved: problems which affect the deterioration of properties of piezoelectric devices including IDT electrodes and which occur in back-end steps and the like because of the use of the IDT electrodes. Furthermore, according to various preferred embodiments of the present invention, a piezoelectric device having such a configuration can be readily manufactured.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 7A-7D are schematic views illustrating steps of manufacturing the thin film-type piezoelectric device in accordance with the flowchart shown in FIG. 5.

FIGS. 9A-9E are schematic views illustrating steps of manufacturing a thin film-type piezoelectric device in accordance with the flowchart shown in FIG. 8.

DETAILED DESCRIPTION OF THE PREFERRED EMBODIMENTS

A piezoelectric device according to a first preferred embodiment of the present invention and a method for manufacturing the piezoelectric device will now be described with reference to the accompanying drawings. The piezoelectric device is described below using a plate wave device as an example. The plate wave device includes IDT electrodes and generates waves which have vibration displacements on both surfaces of a tabular elastic substance (in this preferred embodiment, a piezoelectric thin-film 10) and which propagate along the surfaces. A configuration and manufacturing method below can be applied to a piezoelectric device including other IDT electrodes.

Figure 1A:
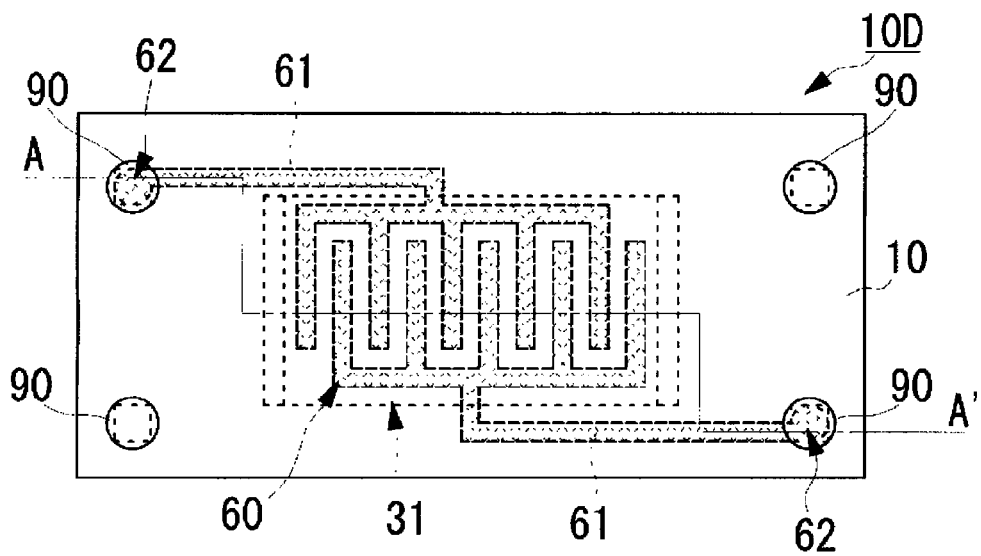
FIGS. 1A-1C include a plan view of a piezoelectric device according to a first preferred embodiment of the present invention, a sectional view thereof, and a schematic sectional view of a piezoelectric device having another configuration.
Figure 1B:
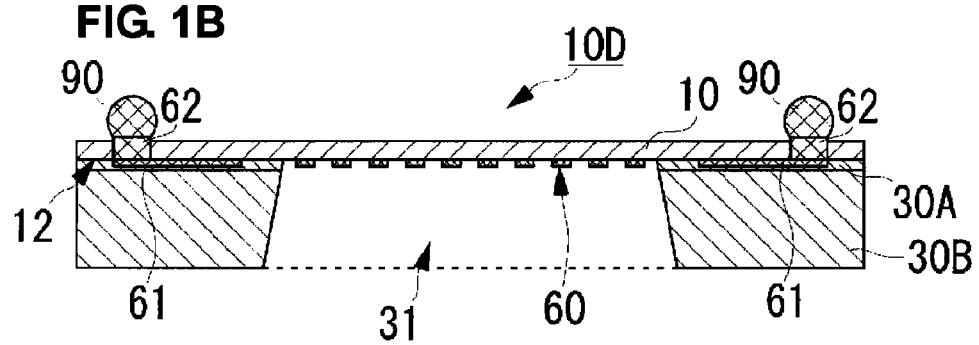
Figure 1C:
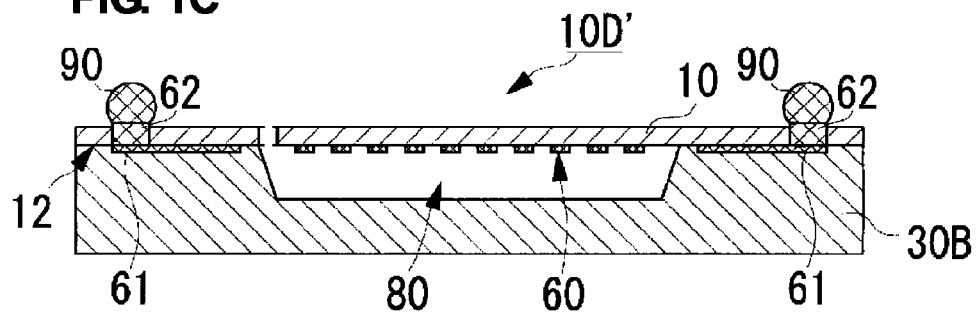

FIG. 1A is a plan view of the piezoelectric device 10D according to this preferred embodiment and FIG. 1B is a sectional view of the piezoelectric device 10D taken along the line A-A' of FIG. 1A. FIG. 1C is a schematic sectional view of a piezoelectric device 10D' having another configuration.

As shown in FIGS. 1A-1C, the piezoelectric device 10D includes the piezoelectric thin-film 10, which has a predetermined thickness, for example, about 1 µm, and a support 30B. The piezoelectric thin-film 10 includes a piezoelectric single crystal substance such as an LT substrate, an LN substrate, an LBO ($Li_2B_4O_7$), or a langasite ($La_3Ga_5SiO_{14}$) substrate. The thickness of the piezoelectric thin-film 10 is preferably set depending on each material such that the piezoelectric device 10D has a target frequency. The support 30B is preferably made of Si or glass or is made from a piezoelectric substrate with a linear expansion coefficient equal or similar to that of the piezoelectric thin-film. The piezoelectric thin-film 10 and the support 30B are bonded to each other with an adhesive layer 30A made of an insulating material such as an organic material or a SiN and so on. IDT electrodes 60 and interconnect electrodes 61 are located on the support 30B side of the piezoelectric thin-film 10. The piezoelectric thin-film 10 has conductive through-holes 62. The conductive through-holes 62 are connected to end portions of the interconnect electrodes 61 that are opposite to end portions of the interconnect electrodes 61 that are connected to the IDT electrodes 60. Bumps 90 serving as external connection terminals are provided on a surface of the piezoelectric thin-film 10 that is opposite to an IDT electrode-formed surface 12 of the piezoelectric thin-film 10 so as to correspond to the positions of the conductive through-holes 62.

The IDT electrode-formed surface 12 of the piezoelectric thin-film 10 includes a region in which the IDT electrodes 60 are provided and no support 30B is disposed but an opening 31 is formed on the IDT electrode 60-formed region. That is, the support 30B supports a region of the piezoelectric thin-film 10 that is other than the IDT electrode 60-formed region and is not in contact with the IDT electrodes 60 or a portion of the piezoelectric thin-film 10 that corresponds to the IDT electrode 60-formed region.

In the case of mounting the piezoelectric device 10D on a circuit board, the support 30B is attached to the circuit board. That is, the bump 90-formed surface of the piezoelectric thin-film 10 corresponds to the front surface of the piezoelectric device 10D and the IDT electrode-formed surface 12 is located in the piezoelectric device 10D.

Therefore, even if a metal powder adheres to the piezoelectric device 10D in a back-end step of assembling the piezoelectric device 10D and another circuit board into a module, the metal powder adheres to the bump-formed surface and does not adhere to the IDT electrode-formed surface 12. Thus, short-circuit failure due to the metal powder can be prevented. Alternatively, even if an organic contaminant adheres thereto to generate gas, this phenomenon occurs on the bump-formed surface and does not affect the IDT electrode-formed surface 12, which is opposite to the bump-formed surface of the piezoelectric thin-film 10. Thus, the IDT electrodes 60 are not corroded by the gas and therefore properties thereof can be prevented from being deteriorated. When the frequency of the plate wave device is adjusted, the surface (the bump-formed surface) of the piezoelectric thin-film 10 that is opposite to the IDT electrode-formed surface 12 thereof can be readily and uniformly ground or milled by ion milling before the bumps 90 are formed. The IDT electrodes 60 are not ground or milled by milling. Thus, the piezoelectric thin-film 10 can be readily ground or milled without unnecessarily grinding or milling the IDT electrodes. This allows a plate wave device having good properties to be accurately and readily achieved.

In the piezoelectric device 10D, the IDT electrode 60-formed region of the piezoelectric thin-film 10 is open as shown in FIGS. 1A and 1B. The above advantageous effects can be achieved using the piezoelectric device 10D', which has a configuration in which a void 80 is formed on a region which is located on the side of a junction between a piezoelectric thin-film 10 and a support 30B and in which IDT electrodes 60 are formed, as shown in FIG. 1C.

The method for manufacturing the piezoelectric device is described below.

Figure 2:
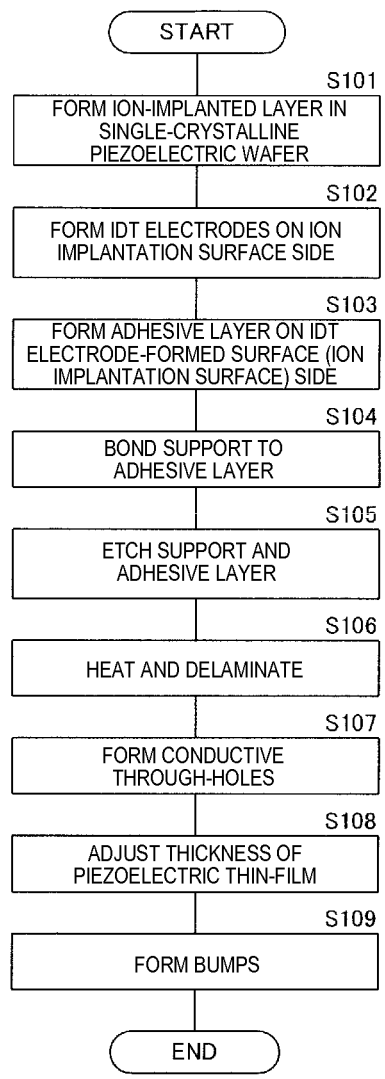
FIG. 2 is a flowchart illustrating a method for manufacturing the piezoelectric device having a configuration shown in FIGS. 1A and 1B.

FIG. 2 is a flowchart illustrating method for manufacturing the piezoelectric device, which has the configuration shown in FIGS. 1A and 1B, according to this preferred embodiment. FIGS. 3A-3E and 4A-4D are schematic views illustrating steps of manufacturing the piezoelectric device in accordance with the flowchart shown in FIG. 2.

Figure 3A:
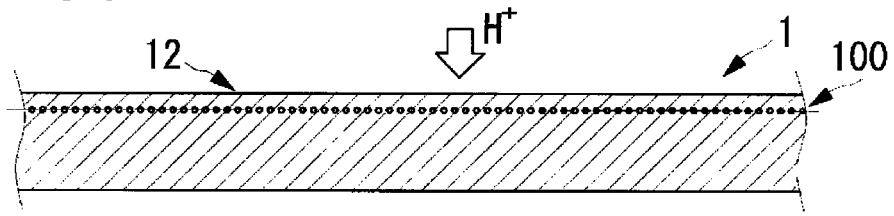
FIGS. 3A-3E are schematic views illustrating steps of manufacturing the thin film-type piezoelectric device in accordance with the flowchart shown in FIG. 2.

A single-crystalline piezoelectric substrate 1 having a predetermined thickness and an area sufficient to arrange or form a plurality of piezoelectric devices is prepared. As shown in FIG. 3A, hydrogen ions are implanted into the single-crystalline piezoelectric substrate 1, whereby an ion-implanted layer 100 is formed (S101 in FIG. 2). In this step, a substrate having a plurality of discretely arranged piezoelectric devices is preferably used as the single-crystalline piezoelectric substrate 1. If, for example, an LT substrate is used as the single-crystalline piezoelectric substrate 1, the ion-implanted layer 100 is formed in such a manner that hydrogen ions are implanted into the substrate at a dose of approximately $1.0 \times 10^{17}$ atoms/$cm^2$ with an acceleration energy of about 150 keV such that a hydrogen ion layer is formed at a depth of about 1 µm from an ion implantation surface 12.

Figure 3B:
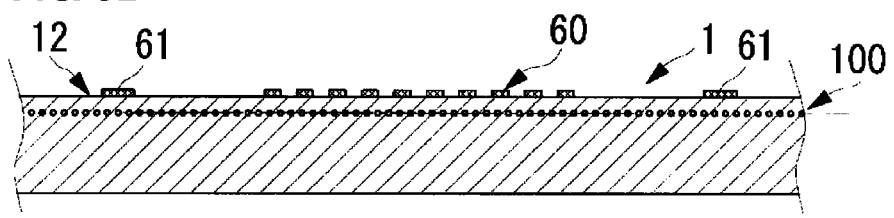
Figure 3C:
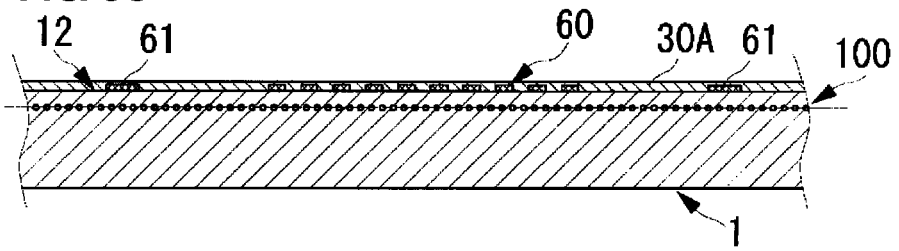

As shown in FIG. 3B, the IDT electrodes 60 and the interconnect electrodes 61 are formed on the ion implantation surface 12 of the single-crystalline piezoelectric substrate 1 (S102 in FIG. 2). The ion implantation surface 12 corresponds to the IDT electrode-formed surface and is referred to as "IDT electrode-formed surface" in this preferred embodiment to a third preferred embodiment. As shown in FIG. 3C, the adhesive layer 30A, which is made of the insulating material such as an organic material or a SiN, is formed on the IDT electrode-formed surface 12 (S103 in FIG. 2). In this step, the adhesive layer 30A is formed so as to have a thickness not less than the thickness of the IDT electrodes 60 or the interconnect electrodes 61 and is planarized by CMP or the like so as to have a flat surface.

Figure 3D:
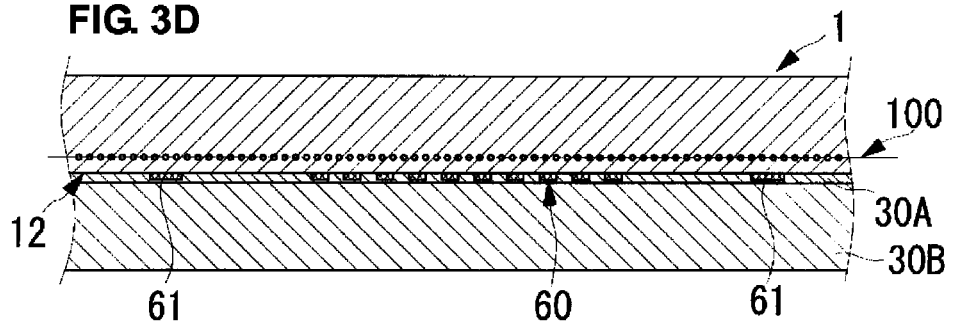

The support 30B, which is made of an appropriately selected material such as Si, glass, or a piezoelectric material identical to the single-crystalline piezoelectric substrate, is prepared. As shown in FIG. 3D, the support 30B is bonded to the IDT electrode-formed surface 12 side of the single-crystalline piezoelectric substrate 1 (S104 in FIG. 2). In this step, the support 30B is cleanly bonded to the adhesive layer 30A and is thereby bonded to the single-crystalline piezoelectric substrate 1.

Figure 3E:
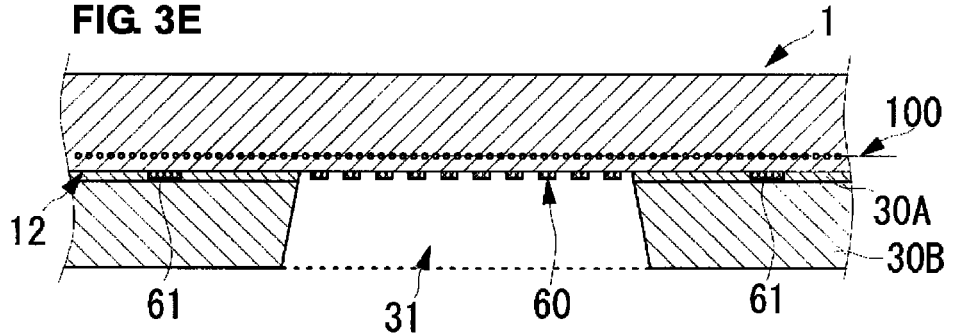

As shown in FIG. 3E, the support 30B and the adhesive layer 30A are etched such that the IDT electrodes 60 on the single-crystalline piezoelectric substrate 1 are exposed from the support 30B, whereby the opening 31 is formed (S105 in FIG. 2).

Figure 4A:
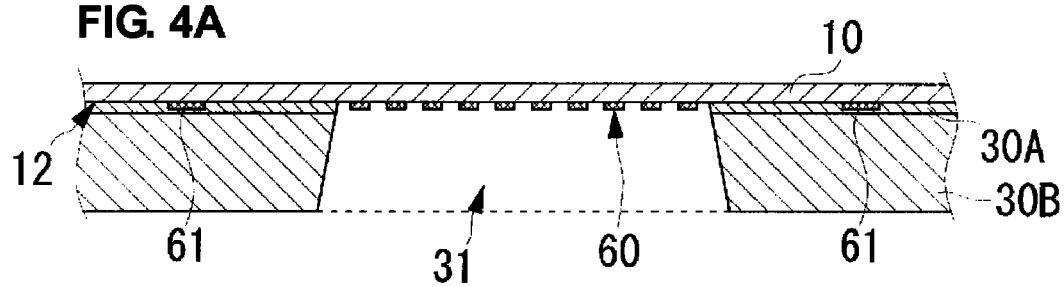
FIGS. 4A-4D are schematic views illustrating steps of manufacturing the thin film-type piezoelectric device in accordance with the flowchart shown in FIG. 2.

A complex prepared by bonding the support 30B to the single-crystalline piezoelectric substrate 1 is heated to, for example, 500° C. This allows the ion-implanted layer 100 to serve as a delamination surface, whereby the piezoelectric thin-film is delaminated from the single-crystalline piezoelectric substrate 1 and a composite piezoelectric substrate is formed as shown in FIG. 4A (S106 in FIG. 2). Polarization electrodes are provided on the IDT electrode-formed surface 12 of the piezoelectric thin-film 10 and a surface of the piezoelectric thin-film 10 that is opposite to the IDT electrode-formed surface 12 thereof using a liquid electrode. The piezoelectric thin-film 10 is polarized by applying an electric field thereto.

Figure 4B:
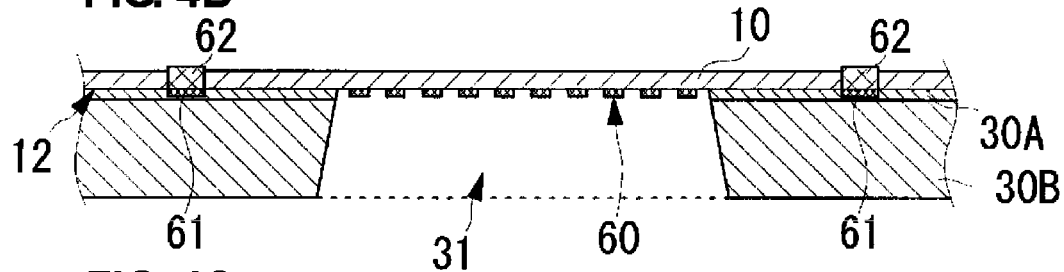

Perforations are formed in portions of the piezoelectric thin-film 10 that correspond to the end portions of the interconnect electrodes 61 that are opposite to the end portions of the interconnect electrodes 61 that are connected to the IDT electrodes 60. A conductor is filled in the perforations, whereby the conductive through-holes 62 are formed as shown in FIG. 4B (S107 in FIG. 2).

A surface of the piezoelectric thin-film 10 that is opposite to the IDT electrode-formed surface 12 thereof is ground or milled for frequency adjustment. This treatment is performed for each piezoelectric device. The piezoelectric thin-film 10 is ground or milled with an ion beam in such a manner that each piezoelectric device is measured for frequency by applying a driving signal to the piezoelectric device through the conductive through-holes 62 and the grinding allowance is calculated from the difference between the target frequency and the measurement. This allows a target frequency to be achieved. Since the surface opposite to the IDT electrode-formed surface 12 is ground or milled as described above, the IDT electrodes 60 are not ground or milled and therefore the deterioration of properties can be prevented.

Figure 4C:
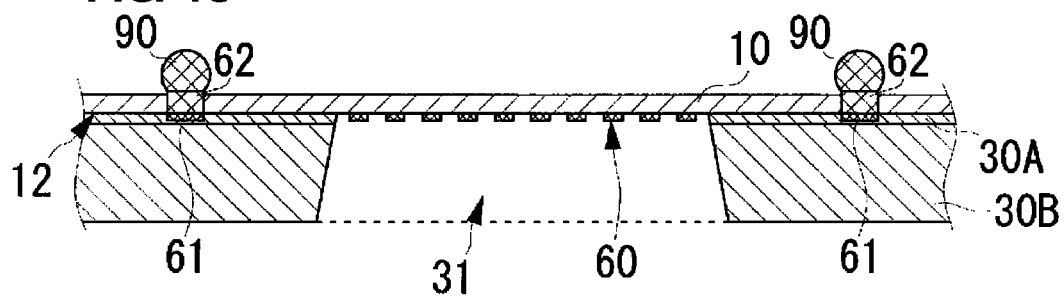
Figure 4D:
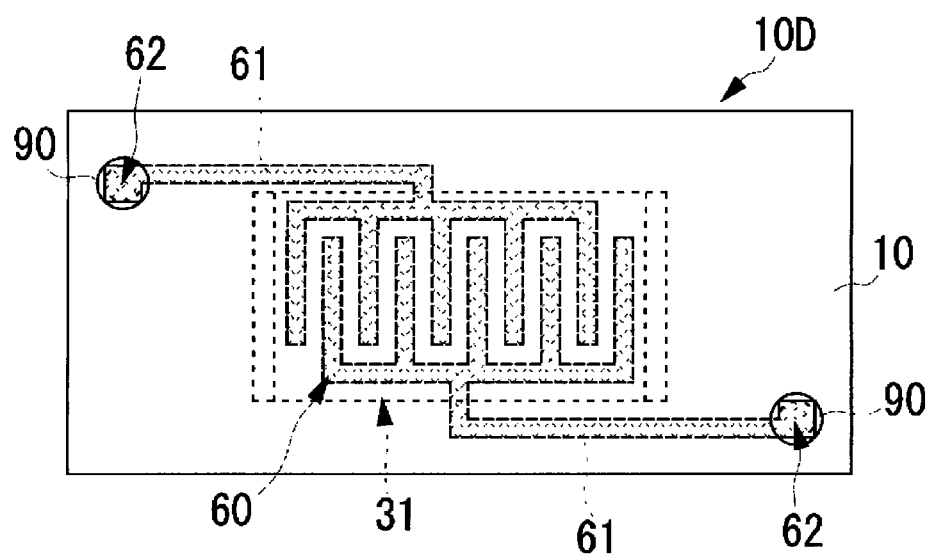

After frequency adjustment is performed as described above, the bumps 90 are formed on the surface of the piezoelectric thin-film 10 that is opposite to the IDT electrode-formed surface 12 thereof so as to be connected to the conductive through-holes 62 as shown in FIG. 4C (S109 in FIG. 2). Through these steps, multiple piezoelectric devices can be manufactured. The multiple piezoelectric devices are separated into pieces, whereby the piezoelectric device shown in FIGS. 4D, 1A, and 1B can be manufactured.

Through the above steps, a configuration in which the IDT electrodes 60 are not formed on the piezoelectric device 10D but are formed therein can be readily achieved.

A method for manufacturing a piezoelectric device according to a second preferred embodiment will now be described. The manufacturing method according to this preferred embodiment corresponds to a method for manufacturing the piezoelectric device 10D' having the configuration shown in FIG. 1C.

Figure 5:
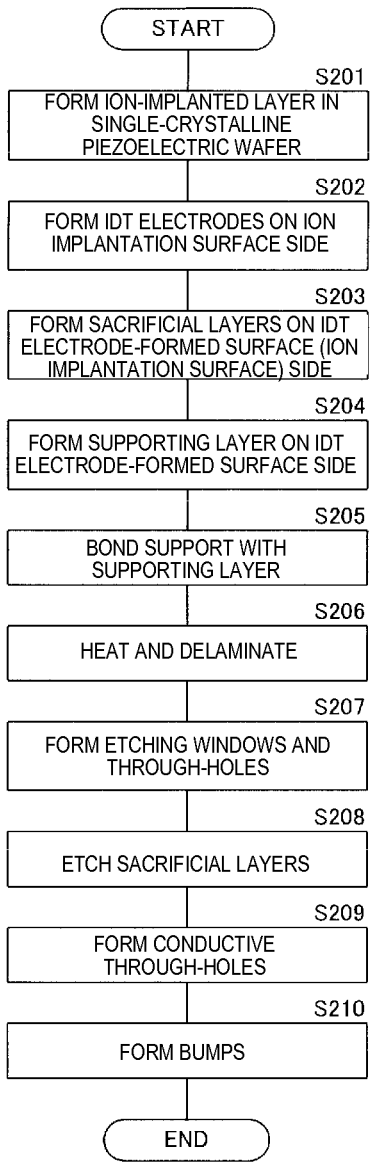
FIG. 5 is a flowchart illustrating a manufacturing method according to a second preferred embodiment of the present invention.

FIG. 5 is a flowchart illustrating the manufacturing method according to this preferred embodiment. FIGS. 6A-6E and 7A-7D are schematic views illustrating steps of manufacturing the piezoelectric device in accordance with the flowchart shown in FIG. 5.

Figure 6A:
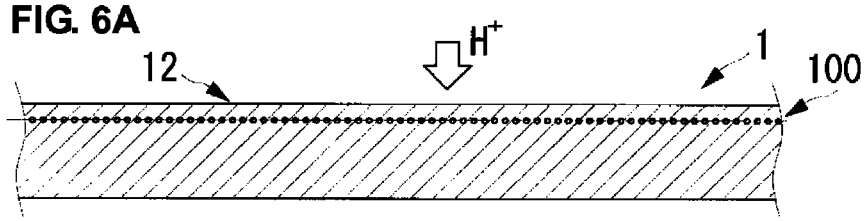
FIGS. 6A-6E are schematic views illustrating steps of manufacturing a thin film-type piezoelectric device in accordance with the flowchart shown in FIG. 5.
Figure 6B:
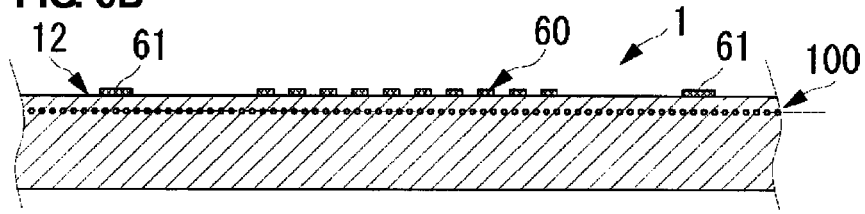

In the manufacturing method according to this preferred embodiment, ion implantation and the formation of IDT electrodes and interconnect electrodes preferably are the same or substantially the same as those described in the first preferred embodiment and will not be described in detail (S201 and S202 in FIG. 5 and FIGS. 6A and 6B).

Figure 6C:
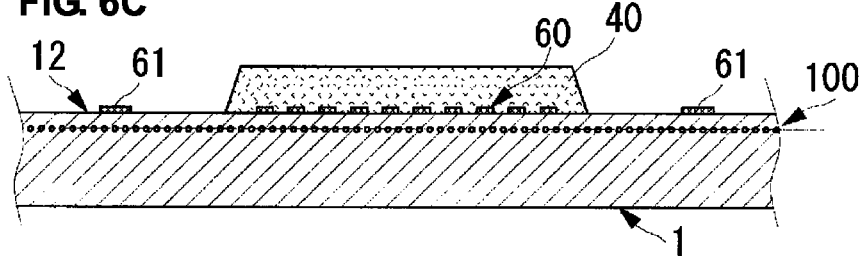

After the IDT electrodes 60 and the interconnect electrodes 61 are formed, sacrificial layers 40 are formed on a IDT electrode-formed surface 12 of a single-crystalline piezoelectric substrate 1 so as to each entirely cover a region in which the IDT electrodes 60 are formed as shown in FIG. 6C (S203 in FIG. 5). The sacrificial layers 40 may be made of a material that can be removed by a treatment below without affecting the IDT electrodes 60. In the case of using oxygen plasma etching or a NMP etching solution, the IDT electrodes 60 may be made of Al, Cu, Au, Pt, Ti, W, Mo, Ni, or Ta and the sacrificial layers 40 may be made of a resin material, the etching ratio of the resin material to a material used to form the IDT electrodes 60 being about 10000 or more.

Figure 6D:
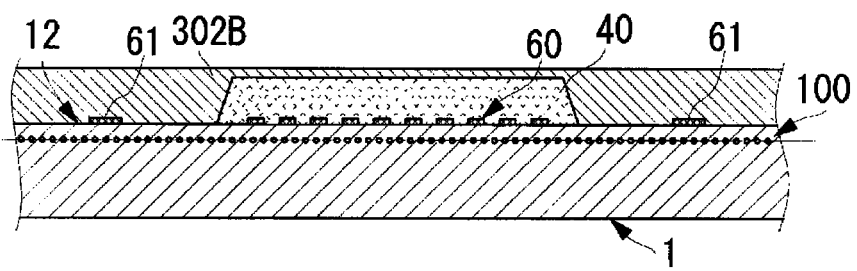

As shown in FIG. 6D, a supporting layer 302B is formed on the IDT electrode-formed surface 12 of the single-crystalline piezoelectric substrate 1 that has the IDT electrodes 60, the interconnect electrodes 61, and the sacrificial layers 40 (S204 in FIG. 5). The supporting layer 302B is made of an insulating material such as SiN and has a flat surface polished by CMP or the like.

Figure 6E:
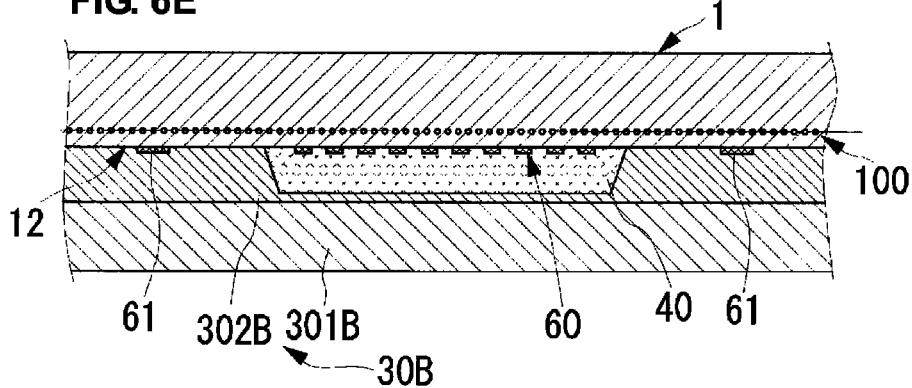

A parent member 301B, made of an appropriately selected material such as Si, glass, or a piezoelectric material identical to the single-crystalline piezoelectric substrate, for forming a support 30B is prepared. As shown in FIG. 6E, the parent member 301B is cleanly bonded to the supporting layer 302B (S205 in FIG. 5). This results in the formation of a complex including, the support 30B made of the parent member 301B and the supporting layer 302B, and the single-crystalline piezoelectric substrate 1.

The complex is heated as described in the first preferred embodiment. This allows an ion-implanted layer 100 to serve as a delamination surface, whereby a piezoelectric thin-film 10 is delaminated from the single-crystalline piezoelectric substrate 1 and a composite piezoelectric substrate is formed as shown in FIG. 7A (S206 in FIG. 5).

A surface of the piezoelectric thin-film 10 delaminated as described above is planarized by a polishing process such as CMP. Polarization electrodes are provided on the piezoelectric thin-film 10 and the piezoelectric thin-film 10 is polarized by applying an electric field thereto as described in the first preferred embodiment.

A resist is applied to a surface of the piezoelectric thin-film 10 that is opposite to the IDT electrode-formed surface 12 thereof and is then patterned. The piezoelectric thin-film 10 is etched by RIE or the like, whereby etching windows 71 and through-holes 72 are formed as shown in FIG. 7B (S207 in FIG. 5). The etching windows 71 are formed in regions in which sacrificial layers 40 are formed and no IDT electrodes 60 are formed. The through-holes 72 are formed at the positions of end portions of the interconnect electrodes 61 that are opposite to end portions of the interconnect electrodes 61 that are connected to the IDT electrodes 60. The resist used to form the etching windows 71 and the through-holes 72 is removed before or after a step of forming the sacrificial layers 40 and the piezoelectric thin-film 10 may be then surface-cleaned.

An etching solution is introduced into the etching windows 71, whereby the sacrificial layers 40 are removed and voids 80 are thereby formed as shown in FIG. 7C (S208 in FIG. 5). This eliminates the sacrificial layers 40 from the IDT electrodes 60 and a surface of the piezoelectric thin-film 10 that has the IDT electrodes 60 and allows a configuration in which the IDT electrodes 60 are not in direct contact with the support 30B to be achieved.

As shown in FIG. 7D, a conductor is filled in the through-holes 72, whereby conductive through-holes 62 are formed (S209 in FIG. 5). Milling is performed for frequency adjustment as described in the first preferred embodiment, whereby bumps 90 are formed on the surface of the piezoelectric thin-film 10 that is opposite to the IDT electrode-formed surface 12 so as to be connected to the conductive through-holes 62 (S210 in FIG. 5).

Through these steps, multiple piezoelectric devices can be manufactured. The multiple piezoelectric devices are separated into pieces, whereby a piezoelectric device shown in FIG. 1C can be manufactured.

A method for manufacturing a piezoelectric device according to a third preferred embodiment will now be described. In the manufacturing method according to this preferred embodiment, sacrificial layers 40 are formed in a support 30B.

Figure 8:
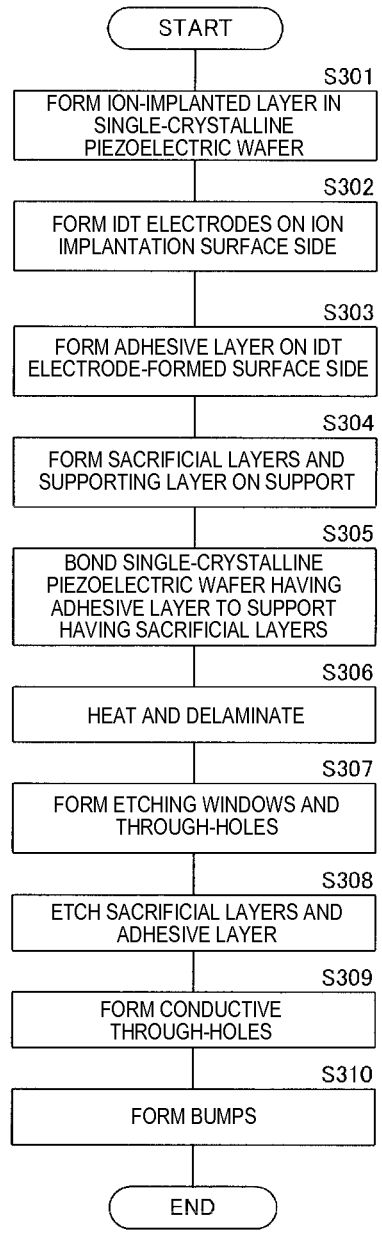
FIG. 8 is a flowchart illustrating a manufacturing method according to a third preferred embodiment of the present invention.

FIG. 8 is a flowchart illustrating the manufacturing method according to the third preferred embodiment. FIGS. 9A-9E and 10A-10D are schematic views illustrating steps of manufacturing the piezoelectric device in accordance with the flowchart shown in FIG. 8.

In the manufacturing method according to this preferred embodiment, ion implantation and the formation of IDT electrodes and interconnect electrodes preferably are the same or substantially the same as those described in the first and second preferred embodiments and will not be described in detail (S301 and S302 in FIG. 8 and FIGS. 9A and 9B).

After the IDT electrodes 60 and the interconnect electrodes 61 are formed, an adhesive layer 30A is formed on a IDT electrode-formed surface 12 of a single-crystalline piezoelectric substrate 1 so as to entirely cover the IDT electrode-formed surface 12 as shown in FIG. 9C (S303 in FIG. 8). The adhesive layer 30A is made of an insulating material capable of being etched as described below and has a thickness sufficient to entirely cover the IDT electrodes 60 and the interconnect electrodes 61.

As shown in FIG. 9D, the sacrificial layers 40 and a supporting layer 302B are formed on a parent member 301B (S304 in FIG. 8). The sacrificial layers 40 are preferably formed from the same material as that used to from the sacrificial layers 40 described in the second preferred embodiment. The sacrificial layers 40 are formed in zones including regions in which the IDT electrodes 60 are to be formed in such a state that the support 30B including the parent member 301B and the supporting layer 302B is bonded to the single-crystalline piezoelectric substrate 1.

As shown in FIG. 9E, the support 30B having the sacrificial layers 40 is cleanly bonded to the IDT electrode-formed surface 12 of the single-crystalline piezoelectric substrate 1 having the IDT electrodes 60, the interconnect electrodes 61, and the adhesive layer 30A (S305 in FIG. 8). This results in the formation of a complex including the support 30B and the single-crystalline piezoelectric substrate 1.

Figure 10A:
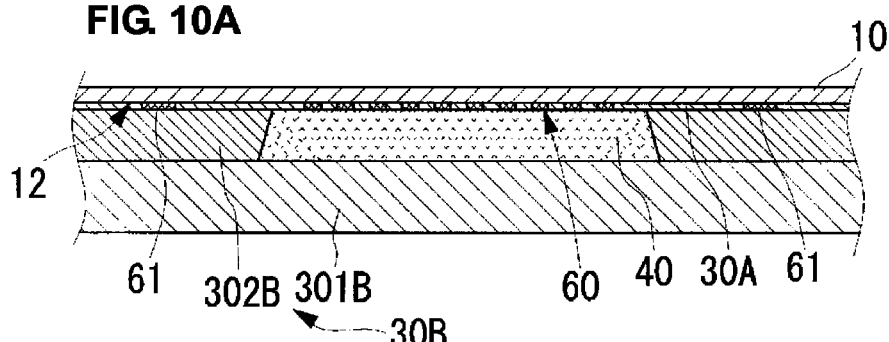
FIGS. 10A-10D are schematic views illustrating steps of manufacturing the thin film-type piezoelectric device in accordance with the flowchart shown in FIG. 8.

The complex is heated as described in the first preferred embodiment. This allows an ion-implanted layer 100 to serve as a delamination surface, whereby a piezoelectric thin-film 10 is delaminated from the single-crystalline piezoelectric substrate 1 and a composite piezoelectric substrate is formed as shown in FIG. 10A (S306 in FIG. 8).

A surface of the piezoelectric thin-film 10 delaminated as described above is planarized by a polishing process such as CMP. Polarization electrodes are provided on the piezoelectric thin-film 10 and the piezoelectric thin-film 10 is polarized by applying an electric field thereto as described in the first preferred embodiment.

Figure 10B:
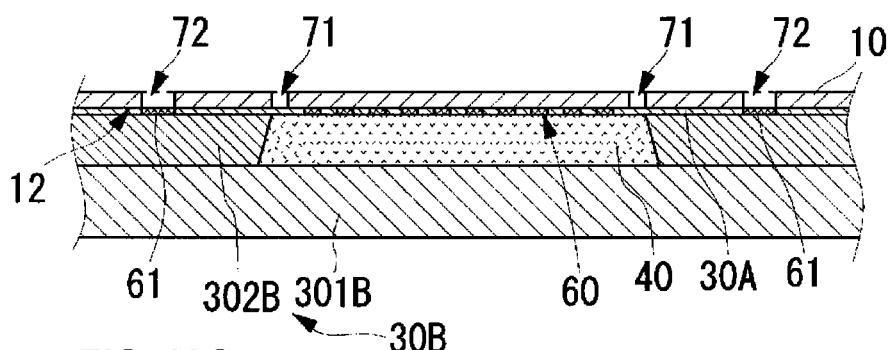

A resist is applied to a surface of the piezoelectric thin-film 10 that is opposite to the IDT electrode-formed surface 12 thereof and is then patterned. The piezoelectric thin-film 10 is etched by RIE or the like, whereby etching windows 71 and through-holes 72 are formed as shown in FIG. 10B (S307 in FIG. 8). The etching windows 71 and the through-holes are formed preferably under the same or substantially the same conditions as those described in the second preferred embodiment.

Figure 10C:
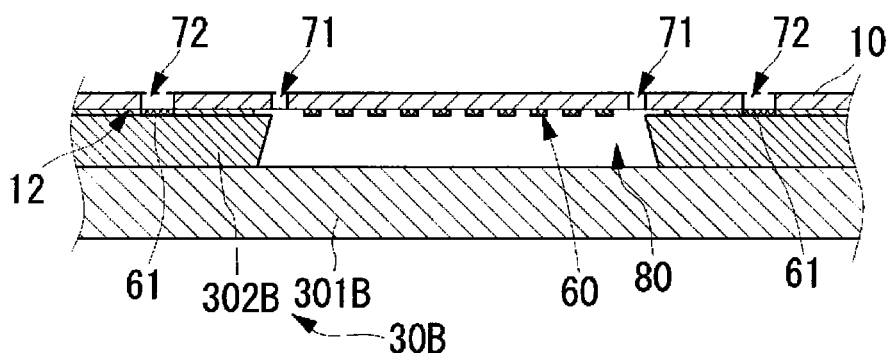

An etching solution is introduced into the etching windows 71, whereby the sacrificial layers 40 and the adhesive layer 30A are removed and voids 80 are thereby formed as shown in FIG. 10C (S308 in FIG. 8). This eliminates the sacrificial layers 40 from the IDT electrodes 60 and a surface of the piezoelectric thin-film 10 that has the IDT electrodes 60 and allows a configuration in which the IDT electrodes 60 are not in direct contact with the support 30B to be achieved.

Figure 10D:
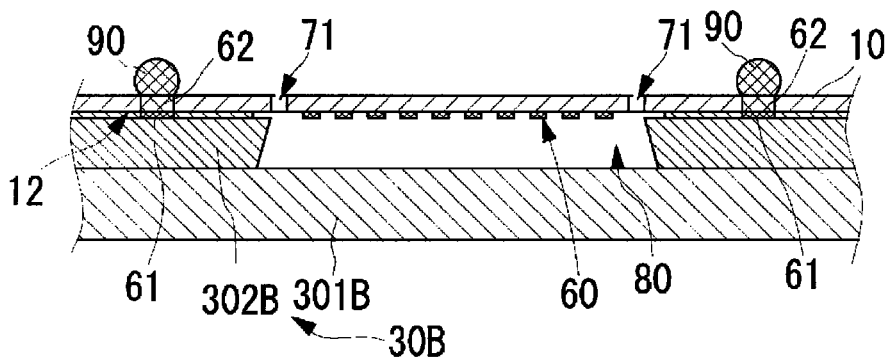

As shown in FIG. 10D, a conductor is filled in the through-holes 72, whereby conductive through-holes 62 are formed (S309 in FIG. 8). Milling is performed for frequency adjustment as described in the first preferred embodiment, whereby bumps 90 are formed on the surface of the piezoelectric thin-film 10 that is opposite to the IDT electrode-formed surface 12 so as to be connected to the conductive through-holes 62 (S310 in FIG. 8).

Through these steps, multiple piezoelectric devices can be manufactured. The multiple piezoelectric devices are separated into pieces, whereby a piezoelectric device can be manufactured.

A method for manufacturing a piezoelectric device according to a fourth preferred embodiment will now be described.

In the piezoelectric device-manufacturing methods according to the first to third preferred embodiments, the IDT electrodes 60 and the interconnect electrodes 61 are formed on the single-crystalline piezoelectric substrate 1 as described above. In each of this preferred embodiment and a fifth preferred embodiment below, a method for forming IDT electrodes 60 and interconnect electrodes 61 are formed on a support 30B is described. In each of this preferred embodiment and the fifth preferred embodiment, since the IDT electrodes 60 are formed on the support 30B, a surface of a single-crystalline piezoelectric substrate 1 that is subjected to ion implantation is referred to as an ion implantation surface 12.

Figure 11:
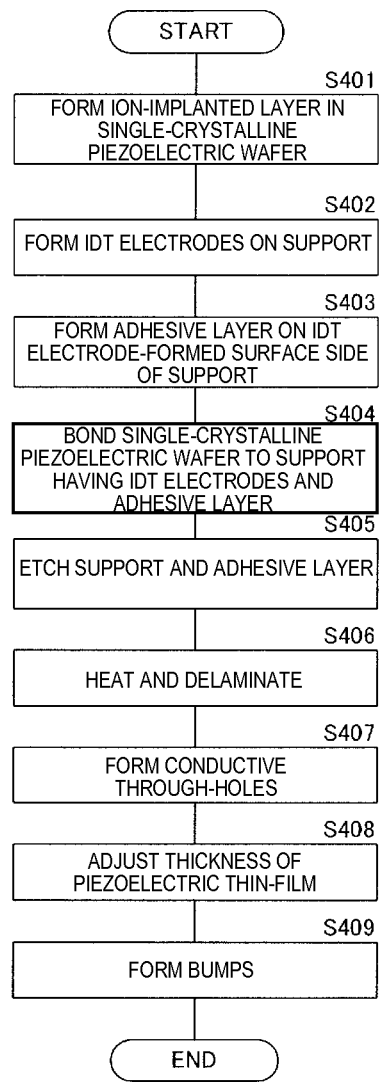
FIG. 11 is a flowchart illustrating a manufacturing method according to a fourth preferred embodiment of the present invention.

FIG. 11 is a flowchart illustrating the manufacturing method according to the fourth preferred embodiment. FIGS. 12A-12E are schematic views illustrating steps of manufacturing the piezoelectric device in accordance with the flowchart shown in FIG. 11. A step of forming a composite piezoelectric substrate and steps subsequent thereto (S407 and steps subsequent thereto in FIG. 11) preferably are the same or substantially the same as those of the manufacturing method according to the first preferred embodiment and will not be described in detail or shown in these figures.

Figure 12A:
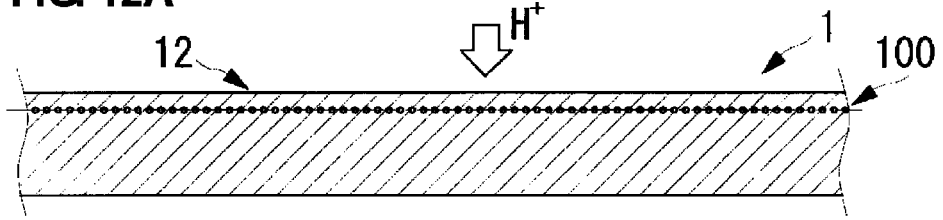
FIGS. 12A-12E are schematic views illustrating steps of manufacturing a thin film-type piezoelectric device in accordance with the flowchart shown in FIG. 11.

A single-crystalline piezoelectric substrate 1 having a predetermined thickness and an area sufficient to arrange or form a plurality of piezoelectric devices is prepared as described in the first preferred embodiment. As shown in FIG. 12A, hydrogen ions are implanted into the single-crystalline piezoelectric substrate 1, whereby an ion-implanted layer 100 is formed (S401 in FIG. 11).

Figure 12B:
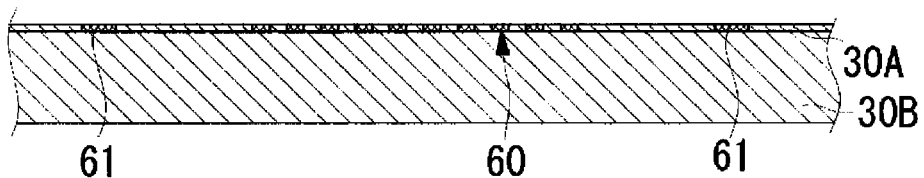

The support 30B is prepared separately from the single-crystalline piezoelectric substrate 1. The support 30B is made of an appropriately selected material such as a piezoelectric material identical to the single-crystalline piezoelectric substrate. As shown in FIG. 12B, the IDT electrodes 60 and the interconnect electrodes 61 are formed on a surface of the support 30B (S402 in FIG. 11). As shown in FIG. 12B, an adhesive layer 30A made of an insulating material such as an organic material or a SiN is formed on the IDT electrode-formed surface of the support 30B (S403 in FIG. 11). In this step, the adhesive layer 30A is formed so as to have a thickness not less than the thickness of the IDT electrodes 60 or the interconnect electrodes 61 and is planarized by CMP or the like so as to have a flat surface.

Figure 12C:
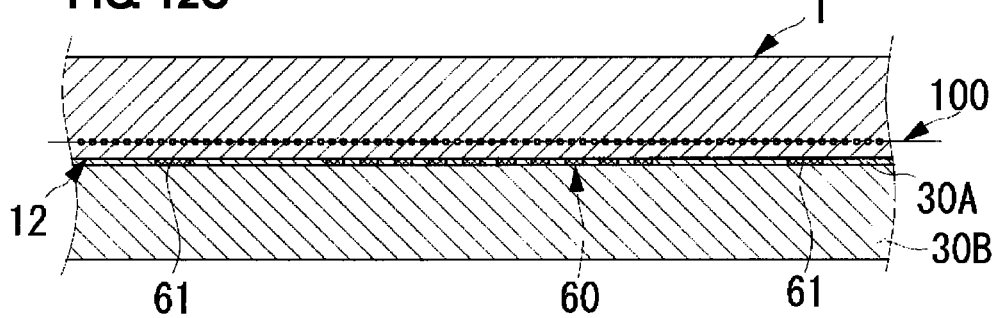

As shown in FIG. 12C, the support 30B is cleanly bonded to the IDT electrode-formed surface 12 of the single-crystalline piezoelectric substrate 1 with the adhesive layer 30A disposed therebetween (S404 in FIG. 11).

Figure 12D:
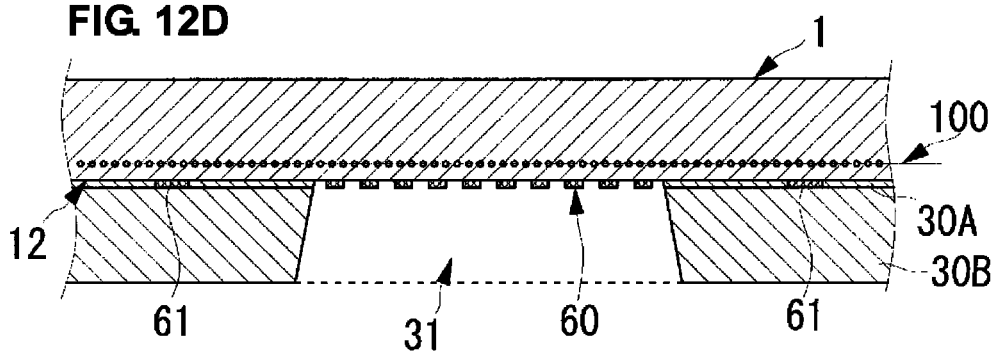

As shown in FIG. 12D, the support 30B and the adhesive layer 30A are etched such that the IDT electrodes 60 on the single-crystalline piezoelectric substrate 1 are exposed from the support 30B, whereby openings 31 are formed (S405 in FIG. 11).

Figure 12E:
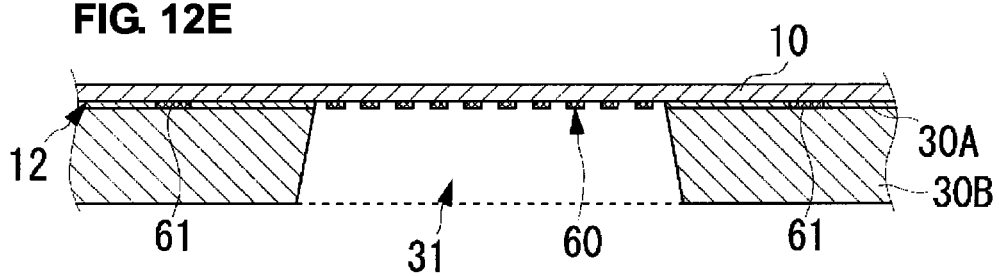

Heating and delamination are performed as described in the first preferred embodiment. This allows the ion-implanted layer 100 to serve as a delamination surface, whereby a piezoelectric thin-film 10 is delaminated from the single-crystalline piezoelectric substrate 1 and a composite piezoelectric substrate is formed as shown in FIG. 12E (S406 in FIG. 11).

A configuration in which the IDT electrodes 60 are not formed on the piezoelectric device but are formed therein can be readily achieved even by the manufacturing method, in which the IDT electrodes 60 and the interconnect electrodes 61 are formed on the support 30B as described above.

A method for manufacturing a piezoelectric device according to a fifth preferred embodiment will now be described. The manufacturing method according to this preferred embodiment is preferably the same as the manufacturing method according to the third preferred embodiment and the other thirds except that IDT electrodes 60 and interconnect electrodes 61 are formed on a support 30B.

Figure 13:
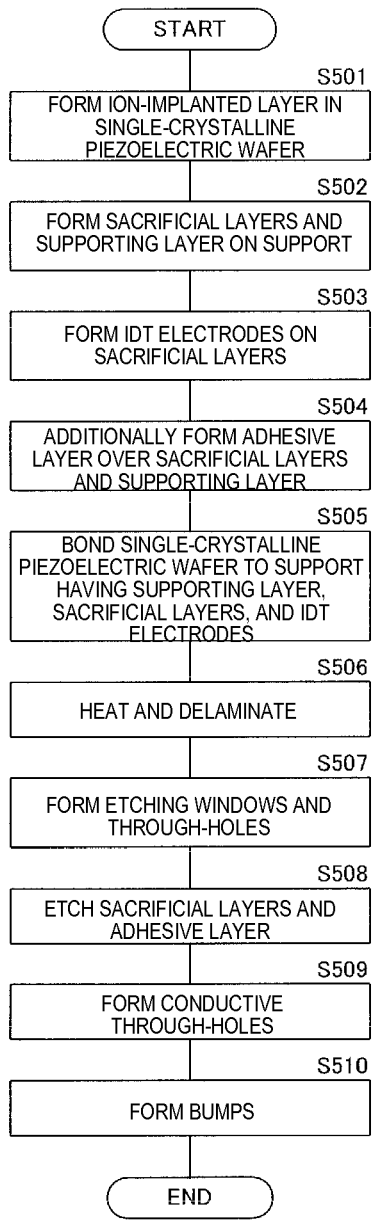
FIG. 13 is a flowchart illustrating a manufacturing method according to a fifth preferred embodiment of the present invention.

FIG. 13 is a flowchart illustrating the manufacturing method according to the fifth preferred embodiment. FIGS. 14A-14D are schematic views illustrating steps of manufacturing the piezoelectric device in accordance with the flowchart shown in FIG. 13. A step of forming a composite piezoelectric substrate and steps subsequent thereto (S507 and steps subsequent thereto in FIG. 13) are preferably the same as those of the manufacturing method according to the third preferred embodiment and will not be described in detail or shown in these figures.

Figure 14A:
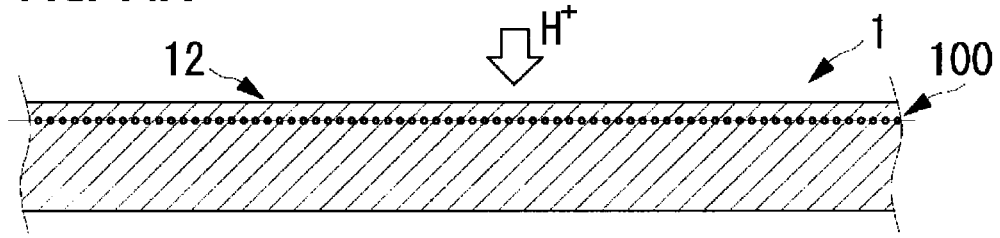
FIGS. 14A-14D are schematic views illustrating steps of manufacturing a thin film-type piezoelectric device in accordance with the flowchart shown in FIG. 13.

A single-crystalline piezoelectric substrate 1 having a predetermined thickness and an area sufficient to arrange or form a plurality of piezoelectric devices is prepared as described in the above-mentioned preferred embodiments. As shown in FIG. 14A, hydrogen ions are implanted into the single-crystalline piezoelectric substrate 1, whereby an ion-implanted layer 100 is formed (S501 in FIG. 13).

Figure 14B:
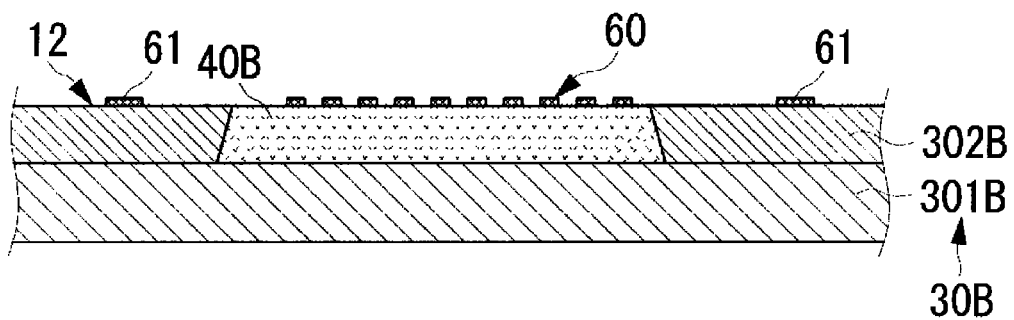
Figure 14C:
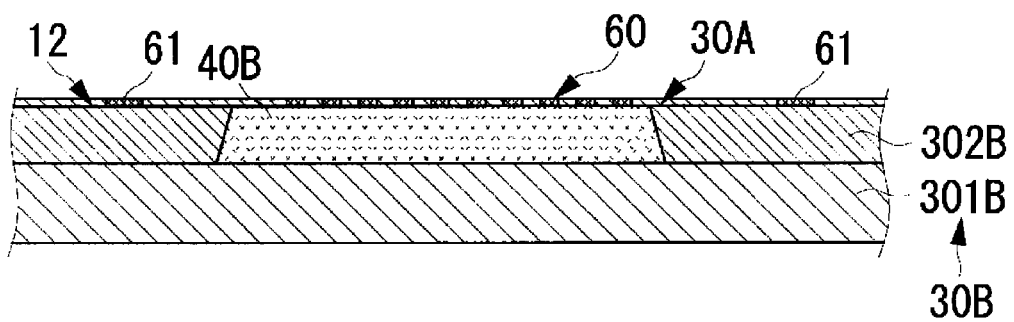

A parent member 301B made of an appropriately selected material such as a piezoelectric material identical to the single-crystalline piezoelectric substrate is prepared separately from the single-crystalline piezoelectric substrate 1. As shown in FIG. 14B, sacrificial layers 40 and a supporting layer 302B are formed on a surface of the parent member 301B (S502 in FIG. 13). As shown in FIG. 14B, in the parent member 301B having the sacrificial layers 40 and supporting layer 302B, the IDT electrodes 60 are formed on a surface of each sacrificial layer 40 and the interconnect electrodes 61 are formed on a surface of the sacrificial layer 40 and a surface of the supporting layer 302B (S503 in FIG. 13). As shown in FIG. 14C, an adhesive layer 30A made of an insulating material such as an organic material or a SiN is formed over the sacrificial layers 40 and the supporting layer 302B (S504 in FIG. 13). In this step, the adhesive layer 30A is formed so as to have a thickness not less than the thickness of the IDT electrodes 60 or the interconnect electrodes 61 and is planarized by CMP or the like so as to have a flat surface.

Figure 14D:
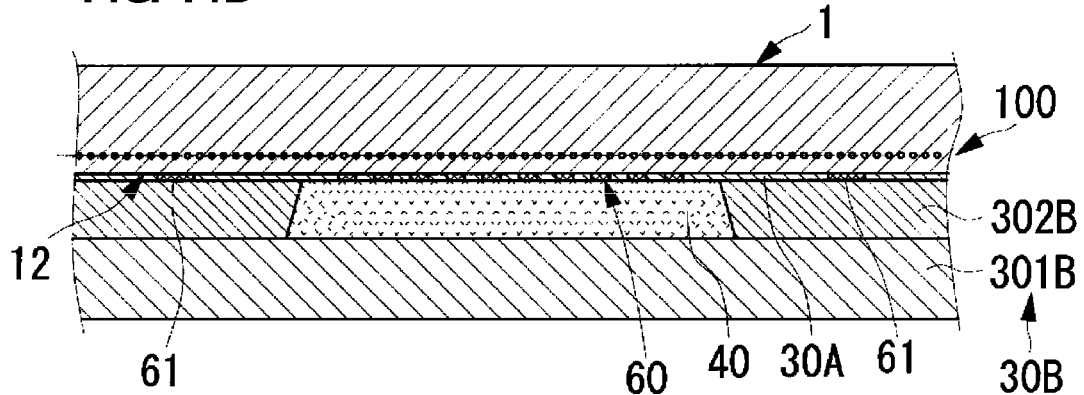

As shown in FIG. 14D, the support 30B, which includes the supporting layer 302B and the parent member 301B, having the sacrificial layers 40 is cleanly bonded to an ion implantation surface 12 of the single-crystalline piezoelectric substrate 1 with the adhesive layer 30A disposed therebetween (S505 in FIG. 13).

Heating and delamination are performed as described in the above-mentioned preferred embodiments. This allows the ion-implanted layer 100 to serve as a delamination surface, whereby a piezoelectric thin-film 10 is delaminated from the single-crystalline piezoelectric substrate 1 and a composite piezoelectric substrate is formed (S506 in FIG. 13). A configuration in which the IDT electrodes 60 are not formed on the piezoelectric device but are formed therein can be readily achieved even by the manufacturing method, in which the sacrificial layers 40 are formed on the support 30B and the IDT electrodes 60 are formed on the sacrificial layers 40 as described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
a support;
a piezoelectric thin-film including opposed main surfaces and being supported by the support on a support side of the piezoelectric thin-film;
IDT electrodes located on the support side of the piezoelectric thin-film to define an IDT electrode region; and
a space located over the IDT electrode region of the piezoelectric thin-film that is located on the support side such that the IDT electrodes are not in contact with the support; wherein
the piezoelectric thin-film is configured such that vibration displacements are generated on both of the opposed main surfaces of the piezoelectric thin-film when a charge is applied to the IDT electrodes; and
the IDT electrodes are located only on the support side of the piezoelectric thin-film such that no IDT electrodes are disposed on a side of the piezoelectric thin-film opposite to the support side.

2. The piezoelectric device according to claim 1, wherein a thickness of the support is greater than a thickness of the piezoelectric thin-film.

3. The piezoelectric device according to claim 1, wherein the support is made of one of Si, glass, or a piezoelectric material.

4. The piezoelectric device according to claim 1, wherein the support is made of a piezoelectric material having a linear expansion coefficient substantially equal to a linear expansion coefficient of the piezoelectric thin-film.

5. The piezoelectric device according to claim 1, wherein the support is disposed directly adjacent to the space such that no structural elements are disposed between the support and the space.

* * * * *